(12) United States Patent
Ina et al.

(10) Patent No.: US 10,403,727 B2
(45) Date of Patent: Sep. 3, 2019

(54) SEMICONDUCTOR DEVICE

(71) Applicant: TOYODA GOSEI CO., LTD., Kiyosu-shi (JP)

(72) Inventors: Tsutomu Ina, Kiyosu (JP); Yukihisa Ueno, Kiyosu (JP); Tohru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 16/129,554

(22) Filed: Sep. 12, 2018

(65) Prior Publication Data

US 2019/0097004 A1 Mar. 28, 2019

(30) Foreign Application Priority Data

Sep. 28, 2017 (JP) ................. 2017-187744

(51) Int. Cl.
| | | |
|---|---|---|
| H01L 29/78 | (2006.01) | |
| H01L 29/40 | (2006.01) | |
| H01L 29/417 | (2006.01) | |
| H01L 29/423 | (2006.01) | |
| H01L 29/06 | (2006.01) | |
| H01L 29/12 | (2006.01) | |
| H01L 29/739 | (2006.01) | |
| H01L 21/8234 | (2006.01) | |

(Continued)

(52) U.S. Cl.
CPC .... *H01L 29/407* (2013.01); *H01L 21/823437* (2013.01); *H01L 29/06* (2013.01); *H01L 29/0657* (2013.01); *H01L 29/12* (2013.01); *H01L 29/1608* (2013.01); *H01L 29/2003* (2013.01); *H01L 29/41766* (2013.01); *H01L 29/4238* (2013.01); *H01L 29/66734* (2013.01); *H01L 29/7397* (2013.01); *H01L 29/7811* (2013.01); *H01L 29/7813* (2013.01); *H01L 29/404* (2013.01)

(58) Field of Classification Search
CPC ............... H01L 21/702; H01L 21/8232; H01L 29/66409
See application file for complete search history.

(56) References Cited

U.S. PATENT DOCUMENTS

| | | | | |
|---|---|---|---|---|
| 6,566,691 | B1 * | 5/2003 | Inoue ............... | H01L 29/66348 257/133 |
| 2010/0187603 | A1 | 7/2010 | Hanaoka | |

FOREIGN PATENT DOCUMENTS

| | | |
|---|---|---|
| JP | 2007-123570 A | 5/2007 |
| JP | 2009-032728 A | 2/2009 |
| JP | 2012-238898 A | 12/2012 |

\* cited by examiner

*Primary Examiner* — Cheung Lee
(74) *Attorney, Agent, or Firm* — McGinn IP Law Group, PLLC.

(57) ABSTRACT

To provide a technique for alleviating electric field concentration at an end portion and the vicinity of the end portion of the bottom surface of a trench. In a non-active region, a semiconductor device comprises: an outer trench penetrating a third semiconductor layer and a second semiconductor layer to reach a first semiconductor layer, and surrounding an active region; a second insulating film covering the surface of the outer trench; a conductor formed in the outer trench covered by the second insulating film and electrically insulated from a control electrode and a contact electrode; and an outer electrode located outside the outer trench, contacting the second semiconductor layer, and being electrically connected to the contact electrode.

6 Claims, 11 Drawing Sheets

(51) Int. Cl.
*H01L 29/66* (2006.01)
*H01L 29/16* (2006.01)
*H01L 29/20* (2006.01)

<CONFIGURATION WITHOUT OUTER ELECTRODE>

SEMICONDUCTOR DEVICE

CROSS-REFERENCE TO RELATED APPLICATION

This application claims priority to Japanese Patent Application No. 2017-187744 filed on Sep. 28, 2017, the entire contents of which are incorporated by reference herein.

BACKGROUND

Technical Field

The present invention relates to a semiconductor device.

Related Art

Various configurations of semiconductor devices for alleviating electric field concentration have been known (as described in, for example, JP 2009-032728A, JP 2012-238898A, JP 2007-123570A).

JP 2009-032728A, JP 2012-238898A, and JP 2007-123570A disclose a configuration including multiple gate electrodes in a potentially-floating state formed in trenches across insulating films in a terminal region that is an outer region of an active region in which a main current flows. JP 2012-238898A discloses a configuration in which an outermost gate electrode of the multiple gate electrodes formed in the terminal region contacts a semiconductor layer. JP 2007-123570A discloses a configuration further including a terminal electrode formed further outside the gate electrodes in the terminal region, covered by an insulating film, and contacting a semiconductor layer.

In each of the configurations of JP 2009-032728A, JP 2012-238898A, and JP 2007-123570A, however, electric field concentration still occurs at a vicinity of an end portion of a bottom surface of an outermost trench in the active region. Hence, these configurations do not achieve sufficient effect of alleviating electric field concentration. Thus, a different technique for alleviating electric field concentration has been desired. In a semiconductor device using silicon (Si), insulation breakdown occurs in a semiconductor layer before it occurs in an insulating film. Meanwhile, in a semiconductor device using a wide band-gap semiconductor such as gallium nitride (GaN), a breakdown field strength is high in a semiconductor layer. Hence, consideration should be given further to an electric field intensity in an insulating film.

Solution to the Problem

The present invention has been made to solve the foregoing problem and is feasible in the following aspects.

(1) According to one aspect of the present invention, a semiconductor device having an active region and a non-active region surrounding the outer periphery of the active region is provided. The semiconductor device includes: a first semiconductor layer having a first conductivity type and extending in a plane direction; a second semiconductor layer formed on the first semiconductor layer and having a second conductivity type different from the first conductivity type; and a third semiconductor layer formed on the second semiconductor layer and having the first conductivity type. The first semiconductor layer, the second semiconductor layer, and the third semiconductor layer are made of a wide band-gap semiconductor. In the active region, the semiconductor device includes a trench, a first insulating film, a control electrode, and a contact electrode. The trench penetrates the third semiconductor layer and the second semiconductor layer to reach the first semiconductor layer. The first insulating film covers the surface of the trench. The control electrode is formed in the trench covered by the first insulating film. The contact electrode contacts the third semiconductor layer. In the non-active region, the semiconductor device includes an outer trench, a second insulating film, a conductor, and an outer electrode. The outer trench penetrates the third semiconductor layer and the second semiconductor layer to reach the first semiconductor layer, and surrounds the active region. The second insulating film covers the surface of the outer trench. The conductor is formed in the outer trench covered by the second insulating film and electrically insulated from the control electrode and the contact electrode. The outer electrode is located outside the outer trench, contacts the second semiconductor layer, and is electrically connected to the contact electrode. The semiconductor device of this aspect includes the conductor and the outer electrode. This makes it possible to alleviate electric field concentration at an end portion and the vicinity of the end portion of the bottom surface of the outer trench at an outermost position in the active region.

(2) In the foregoing semiconductor device, the second insulating film may have a higher dielectric constant than the first insulating film. The semiconductor device of this aspect makes it possible to more effectively alleviate electric field concentration at an outer bottom surface and the vicinity of the outer bottom surface of an outermost trench.

(3) In the foregoing semiconductor device, in a view taken in a thickness direction perpendicular to the plane direction, the control electrode may have a mesh pattern with tightly arranged polygons, and the control electrode may include a projecting portion formed at a corner of the corners of each of the polygons nearest to the conductor and projecting toward the conductor. The semiconductor device of this aspect allows a larger current to flow.

(4) In the foregoing semiconductor device, in a view taken in a thickness direction perpendicular to the plane direction, the control electrode may have a mesh pattern with tightly arranged polygons, the conductor may have a shape extending along the outer periphery of the pattern with the tightly arranged polygons, and the conductor may have a projecting portion formed at a corner of the corners of each of the polygons of the conductor nearest to the control electrode and projecting toward the control electrode. The semiconductor device of this aspect also makes it possible to more efficiently alleviate electric field concentration at the bottom surface and the vicinity of the bottom surface of the trench at a corner of the control electrode nearest to the conductor.

(5) The foregoing semiconductor device may include a plurality of the contact electrodes. The multiple contact electrodes located outside the control electrode and inside the conductor may include a connection electrically connecting adjacent ones of the contact electrodes. The semiconductor device of this aspect allows a larger current to flow.

(6) In the foregoing semiconductor device, the trench may have an outermost end portion formed to be separated from the outer trench by a constant distance. The semiconductor device of this aspect makes it possible to more effectively alleviate electric field concentration at the bottom surface and the vicinity of the bottom surface of the outermost end portion of the trench.

The present invention is feasible in various aspects other than a semiconductor device. These aspects include a method of manufacturing a semiconductor device and a device of manufacturing a semiconductor device using this manufacturing method, for example.

The semiconductor device of the present invention includes the conductor and the outer electrode. This makes it possible to alleviate electric field concentration at an end portion and the vicinity of the end portion of the bottom surface of the outer trench.

DESCRIPTION OF EMBODIMENTS

A. First Embodiment

A-1. Configuration of Semiconductor Device

Figure 1:
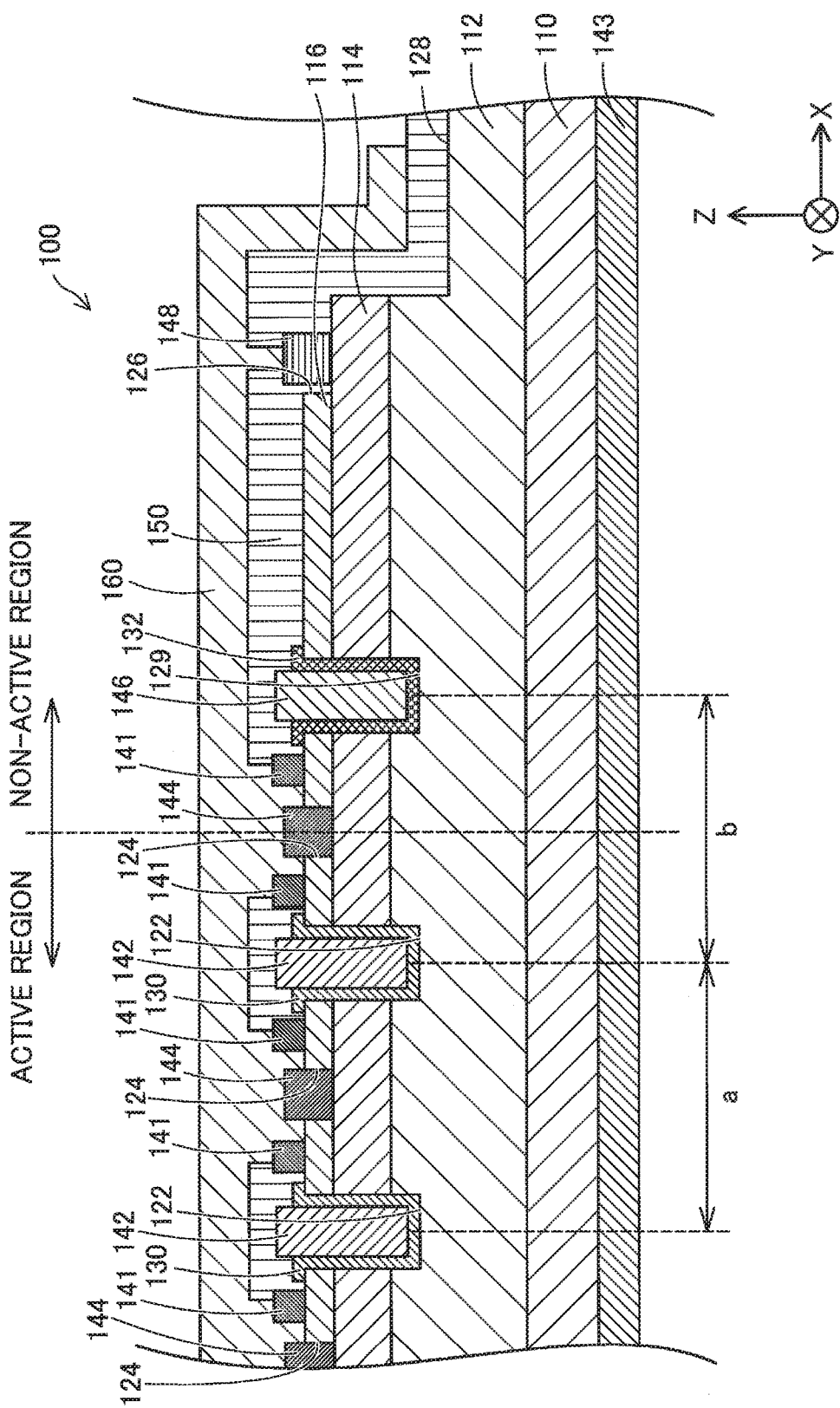
FIG. 1 is a sectional view schematically showing the configuration of a semiconductor device according to a first embodiment.

FIG. 1 is a sectional view schematically showing the configuration of a semiconductor device 100 according to a first embodiment. In this embodiment, the semiconductor device 100 is a vertical trench metal-oxide-semiconductor field-effect transistor (MOSFET). In this embodiment, the semiconductor device 100 is used for power control, and thus also called a power device.

An X axis, a Y axis, and a Z axis orthogonal to each other are illustrated in FIG. 1. The X axis as one of the X, Y, and Z axes in FIG. 1 is an axis extending from left to right in the plane of the sheet of FIG. 1. A +X axis direction is a rightward direction in the plane of the sheet. A −X axis direction is a leftward direction in the plane of the sheet. The Y axis as one of the X, Y, and Z axes in FIG. 1 is an axis extending from front to back in the plane of the sheet of FIG. 1. A +Y axis direction is a backward direction in the plane of the sheet. A −Y axis direction is a frontward direction in the plane of the sheet. The Z axis as one of the X, Y, and Z axes in FIG. 1 is an axis extending from bottom to top in the plane of the sheet of FIG. 1. A +Z axis direction is an upward direction in the plane of the sheet. A −Z axis direction is a downward direction in the plane of the sheet.

The semiconductor device 100 includes a substrate 110, a first semiconductor layer 112, a second semiconductor layer 114, and a third semiconductor layer 116. The semiconductor device 100 further includes a first insulating film 130, a second insulating film 132, a third insulating film 150, a source electrode 141, a body electrode 144, a gate electrode 142, a drain electrode 143, a conductor 146, an outer electrode 148, and a wiring electrode 160. The "gate electrode 142" corresponds to the "control electrode" in SOLUTION TO PROBLEM. The "source electrode 141" and the "body electrode 144" correspond to the "contact electrode" in SOLUTION TO PROBLEM.

In this embodiment, the substrate 110, the first semiconductor layer 112, the second semiconductor layer 114, and the third semiconductor layer 116 are made of a wide band-gap semiconductor. Examples of the wide band-gap semiconductor include gallium nitride (GaN), diamond (C), silicon carbide (SiC), and gallium oxide (GaO). In this embodiment, the substrate 110, the first semiconductor layer 112, the second semiconductor layer 114, and the third semiconductor layer 116 are made of gallium nitride (GaN).

The substrate 110, the first semiconductor layer 112, and the third semiconductor layer 116 have a first conductivity type that is one of an n-type and a p-type. The second semiconductor layer 114 has a second conductivity type that is one of the n-type and the p-type and different from the first conductivity type. In this embodiment, the substrate 110, the first semiconductor layer 112, and the third semiconductor layer 116 have n-type characteristics, and the second semiconductor layer 114 has p-type characteristics. Alternatively, the substrate 110, the first semiconductor layer 112, and the third semiconductor layer 116 may have p-type characteristics, and the second semiconductor layer 114 may have n-type characteristics.

The substrate 110 and the first semiconductor layer 112 in the semiconductor device 100 are plate-like semiconductor layers extending in a plane direction along the X axis and the Y axis. In this embodiment, the substrate 110 and the first semiconductor layer 112 are n-type semiconductors containing silicon (Si) as a donor element. In this embodiment, the substrate 110 contains a donor element of a higher concentration that the first semiconductor layer 112. In this embodiment, the first semiconductor layer 112 is a layer formed on the substrate 110 by metal organic chemical vapor deposition (MOCVD).

The second semiconductor layer 114 in the semiconductor device 100 is a semiconductor layer located on the first semiconductor layer 112 (to the +Z axis direction) and extending along the X axis and the Y axis. In this embodiment, the second semiconductor layer 114 is a p-type semiconductor containing magnesium (Mg) as an acceptor element.

The third semiconductor layer 116 in the semiconductor device 100 is a semiconductor layer located on the second semiconductor layer 114 (to the +Z axis direction) and extending along the X axis and the Y axis. In this embodiment, the third semiconductor layer 116 is an n-type semiconductor containing silicon (Si) as a donor element.

The body electrode 144 functioning as a contact electrode in the semiconductor device 100 is an electrode formed in a contact hole 124 penetrating the third semiconductor layer 116. The body electrode 144 contacts the second semiconductor layer 114. In this embodiment, the body electrode 144 forms ohmic contact with the second semiconductor layer 114.

In this embodiment, the body electrode 144 is made of palladium (Pd). However, this is not the limited material for forming the body electrode 144. For example, the body electrode 144 may be formed as follows: (i) The body electrode 144 is made of a material such as nickel (Ni) other than palladium; and (ii) The body electrode 144 includes a layer made of titanium (Ti) as a layer contacting the second semiconductor layer 114, and a layer made of aluminum (Al) formed on the titanium layer. The body electrode 144 may include a single layer, or two or more layers.

The source electrode 141 functioning as a contact electrode in the semiconductor device 100 is an electrode formed on the third semiconductor layer 116 (to the +Z axis direction). The source electrode 141 contacts the third semiconductor layer 116. In this embodiment, the source electrode 141 forms ohmic contact with the third semiconductor layer 116.

In this embodiment, the source electrode 141 includes the following layers: a layer made of titanium (Ti) as a layer contacting the third semiconductor layer 116; and a layer made of aluminum (Al) formed on the titanium layer. However, these not the limited materials for forming the source electrode 141. The source electrode 141 may alternatively include the following layers, for example: a layer made of titanium (Ti) as a layer contacting the third semiconductor layer 161; a layer made of aluminum (Al) formed on the titanium layer; a layer made of nickel (Ni) formed on the aluminum layer; and a layer made of gold (Au) formed on the nickel layer. The source electrode 141 may include a single layer, or two or more layers. The source electrode 141 may contact the body electrode 144 and may be one electrode having two functions as the source electrode 141 and the body electrode 144 contacting the third semiconductor layer 116 and the second semiconductor layer 114.

A trench 122 in the semiconductor device 100 is a groove penetrating the second semiconductor layer 114 and the third semiconductor layer 116 to reach the first semiconductor layer 112. In this embodiment, the trench 122 is formed by dry etching on the first semiconductor layer 112, the second semiconductor 114, and the third semiconductor layer 116.

The first insulating film 130 in the semiconductor device 100 is a film covering the surface of the trench 122 and having electrically insulating properties. In this embodiment, the first insulating film 130 is formed inside the trench 122 and further formed to cover a part of a surface of the third semiconductor layer 116 closer to the +Z axis direction.

In this embodiment, the first insulating film 130 is made of silicon dioxide ($SiO_2$). Any material having electrically insulating properties is applicable as a material for forming the first insulating film 130. In addition to silicon dioxide ($SiO_2$), a material for the first insulating film 130 may be at least one of silicon nitride ($SiN_x$), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON), and hafnium oxynitride (HfON), for example. The first insulating film 130 may include a single layer, or two or more layers.

The gate electrode 142 functioning as a control electrode in the semiconductor device 100 is an electrode formed in the trench 122 covered by the first insulating film 130. If a voltage is applied to the gate electrode 142, an inversion layer is formed in the second semiconductor layer 114 and this inversion layer functions as a channel, thereby forming a conducting path between the source electrode 141 and the drain electrode 143.

Figure 2:
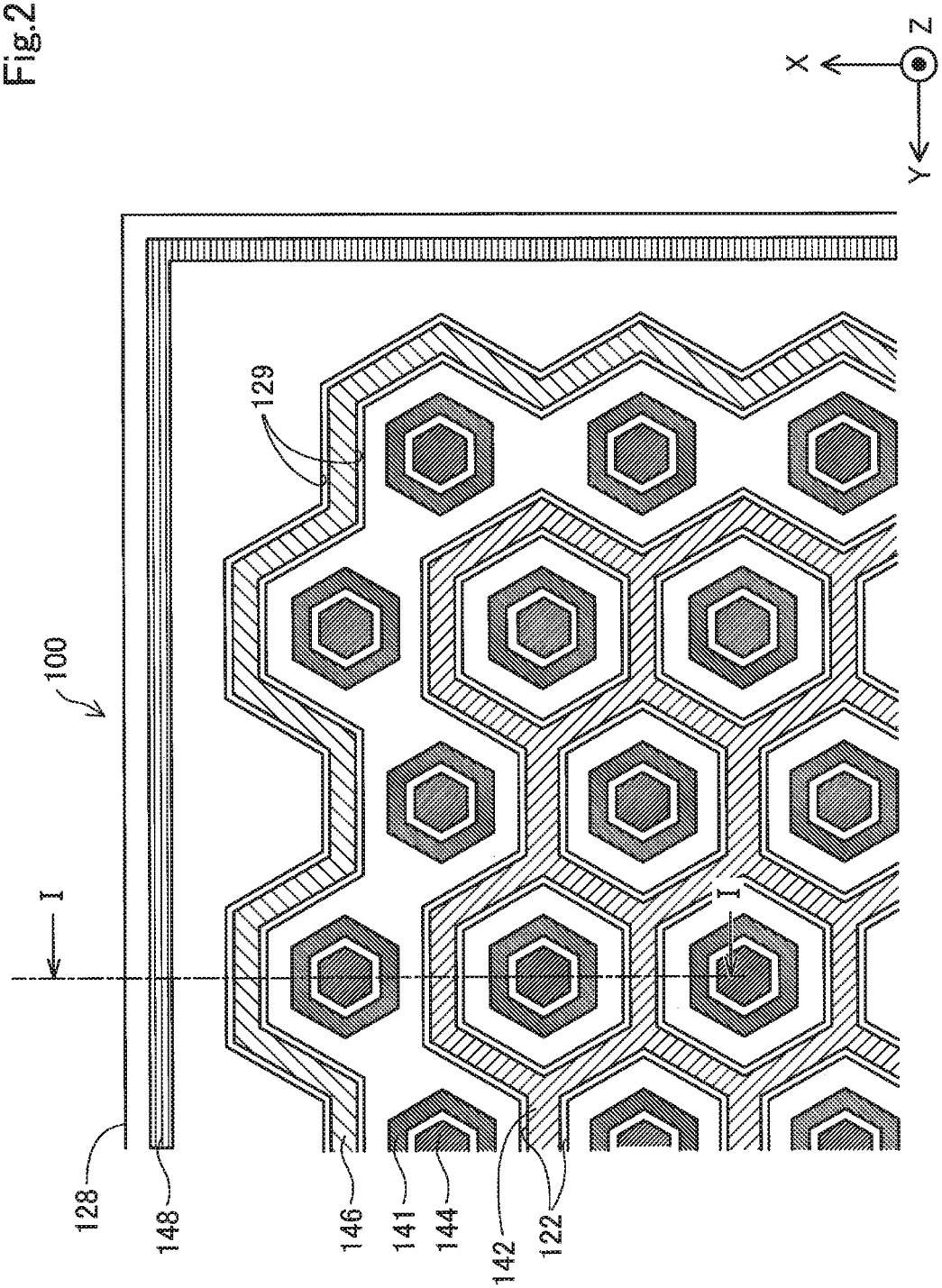
FIG. 2 is a view taken in a thickness direction (Z axis direction)

In this embodiment, the gate electrode 142 is made of aluminum (Al). The gate electrode 142 may be made of a different material. For example, the gate electrode 142 may be made of titanium (Ti), polysilicon, or a metal nitride. The gate electrode 142 may include a single layer, or two or more layers. While not shown in FIG. 1, the gate electrodes 142 are electrically connected to each other as shown in FIG. 2, for example.

The semiconductor device 100 has an active region and a non-active region surrounding the outer periphery of the active region. The active region is a region in which a current mainly flows when the semiconductor device 100 is driven. The active region is an inner region and the non-active region is an outer region relative to the body electrode 144 as a boundary provided between an outer trench 129 and the trench 122 adjacent to the outer trench 129. The semiconductor device 100 includes the trench 122, the first insulating film 130, the gate electrode 142, and the source electrode 141 in the active region. The semiconductor device 100 includes the outer trench 129, the second insulating film 132, the conductor 146, and the outer electrode 148 in the non-active region.

The outer trench 129 in the semiconductor device 100 is a groove surrounding the active region and located outside the gate electrode 142 and the source electrode 141. The outer trench 129 is a groove penetrating the third semiconductor layer 116 and the second semiconductor layer 114 to reach the first semiconductor layer 112. In this embodiment, the outer trench 129 has the same depth as the trench 122. This makes it possible to form the outer trench 129 simultaneously with the trench 122 in an etching step of forming the trench 122. The outer trench 129 may have a different depth from the trench 122.

In this embodiment, a distance a between adjacent trenches 122 is equal to a distance b between the outer trench 129 and a trench 122 adjacent to the outer trench 129. The distance a between adjacent trenches 122 is a distance between the center axes of the adjacent trenches 122 in a plane passing through the center axes of the multiple body electrodes 144. Likewise, the distance b between the outer trench 129 and a trench 122 adjacent to the outer trench 129 is a distance from the center axis of the adjacent trench 122 to the center axis of the outer trench 129 in the plane passing through the center axes of the multiple body electrodes 144. The cross section shown in FIG. 1 is taken at the plane passing through the center axes of the multiple body electrodes 144.

The second insulating film 132 in the semiconductor device 100 is a film covering the surface of the outer trench 129 and having electrically insulating properties. In this embodiment, the second insulating film 132 is formed inside the outer trench 129 and further formed to cover a part of the surface of the third semiconductor layer 116 closer to the +Z axis direction.

In this embodiment, the second insulating film 132 is made of aluminum oxide ($Al_2O_3$). Thus, in this embodiment, the second insulating film 132 has a higher dielectric constant than the first insulating film 130. This makes it possible to more effectively alleviate electric field concentration at an outer bottom surface and the vicinity of the outer bottom surface of the outermost trench 122. Examples of a material applicable for forming the second insulating film 132 and having a higher dielectric constant than the material for the first insulating film 130 include aluminum nitride (AlN), zirconium oxide ($ZrO_2$), hafnium oxide ($HfO_2$), silicon oxynitride (SiON), aluminum oxynitride (AlON), zirconium oxynitride (ZrON), and hafnium oxynitride (HfON). The second insulating film 132 may be made of the same material as the first insulating film 130. This makes it possible to form the second insulating film 132 simultaneously with the first insulating film 130 during formation of the first insulating film 130.

The conductor 146 in the semiconductor device 100 is a layer formed in the outer trench 129 covered by the second insulating film 132. The conductor 146 is electrically insulated from the gate electrode 142 and the source electrode 141. Briefly, the conductor 146 is in an electrically-floating state. In this embodiment, the conductor 146 is made of aluminum (Al). The conductor 146 may be made of a different material. For example, the conductor 146 may be made of a different metal such as titanium (Ti), or a different conductive material such as polysilicon or a metal nitride.

The outer electrode 148 in the semiconductor device 100 is an electrode formed in a contact hole 126 penetrating the third semiconductor layer 116. The outer electrode 148 is located outside the outer trench 129 and contacts the second semiconductor layer 114. In this embodiment, the outer electrode 148 surrounds the outer periphery of the outer trench 129. The outer electrode 148 is electrically connected to the source electrode 141 through the wiring electrode 160. In this embodiment, the outer electrode 148 is made of palladium (Pd). However, this is not the limited material for forming the outer electrode 148. For example, the outer electrode 148 may be formed as follows: (i) The outer electrode 148 is made of a different metal such as nickel (Ni); and (ii) The outer electrode 148 includes a layer made of titanium (Ti) as a layer contacting the second semiconductor layer 114, and a layer made of aluminum (Al) formed on the titanium layer. The outer electrode 148 may include a single layer or multiple layers. The outer electrode 148 forms ohmic contact with the second semiconductor layer 114.

A trench 128 in the semiconductor device 100 is a groove extending in a depth direction corresponding to the thickness direction (to the −Z axis direction) of the semiconductor layer 114 or 116. The trench 128 is a groove penetrating the third semiconductor layer 116 and the second semiconductor layer 114 to reach the first semiconductor layer 112. In this embodiment, the trench 128 has a greater depth than the trench 122 and the outer trench 129. The trench 128 is used for isolating the semiconductor device 100 from other elements. In this embodiment, the trench 128 is located further outside the outer electrode 148.

The third insulating film 150 in the semiconductor device 100 is formed to cover the surfaces of the semiconductor layers 112, 114, and 116 (surfaces closer to the +Z axis direction). The third insulating film 150 has openings formed to partially expose the source electrode 141, the body electrode 144, and the gate electrode 142. In this embodiment, the third insulating film 150 is made of aluminum oxide ($Al_2O_3$). Any material having electrically insulating properties is applicable as a material for forming the third insulating film 150. In addition to aluminum oxide ($Al_2O_3$), a material for the third insulating film 150 may be at least one of silicon dioxide ($SiO_2$), silicon nitride (SiNx), aluminum nitride (AlN), zirconium oxide ($ZrO_2$), hafnium oxide ($HfO_2$), silicon oxynitride (SiON), aluminum oxynitride (AlON), zirconium oxynitride (ZrON), and hafnium oxynitride (HfON), for example. The third insulating film 150 may include a single layer or multiple layers.

The wiring electrode 160 is an electrode formed on the third insulating film 150 (to be closer to the +Z axis direction). The wiring electrode 160 electrically connects the source electrode 141, the body electrode 144, and the outer electrode 148. The wiring electrode 160 is further formed on the side wall and the bottom surface of the trench 128 covered by the third insulating film 150.

The drain electrode 143 in the semiconductor device 100 is an electrode formed on a surface of the substrate 110 closer to the −Z axis direction. The drain electrode 143 contacts the substrate 110. In this embodiment, the drain electrode 143 forms ohmic contact with the substrate 110.

In this embodiment, the drain electrode 143 includes the following layers: a layer made of titanium (Ti) as a layer contacting the substrate 110; and a layer made of aluminum (Al) formed on the titanium layer. The drain electrode 143 may be made of a different material. For example, the drain electrode 143 may include the following layers: a layer made of titanium (Ti) as a layer contacting the substrate 110; a layer made of aluminum (Al) formed on the titanium layer; a layer made of nickel (Ni) formed on the aluminum layer; and a layer made of gold (Au) formed on the nickel layer. The drain electrode 143 may include a single layer or multiple layers.

FIG. 2 shows the configuration in FIG. 1 viewed in the +Z axis direction. Specifically, FIG. 2 is a plan view taken in the thickness direction (Z axis direction) perpendicular to the plane direction (corresponding to the X axis direction and the Y axis direction). From a viewpoint of facilitating understanding, illustrations of the first insulating film 130, the second insulating film 132, the third insulating film 150, and the wiring electrode 160 are omitted from FIG. 2. A cross section taken along a line I-I in FIG. 2 corresponds to the cross section in FIG. 1.

As shown in FIG. 2, in this embodiment, the body electrode 144 has a hexagonal shape. The source electrode 141 surrounds the body electrode 144 across the third semiconductor layer 116. The source electrode 141 is hexagonal both at the inner periphery and the outer periphery of the source electrode 141. In this embodiment, the semiconductor device 100 includes multiple body electrodes 144 and multiple source electrodes 141. The source electrodes 141 include a source electrode 141 located outside the gate electrode 142 and inside the conductor 146.

In this embodiment, the gate electrode 142 surrounds the source electrode 141 across the third semiconductor layer 116. The gate electrodes 142 are continuous with each other on a surface of the semiconductor device 100 (surface closer to the +Z axis direction) and have a mesh pattern with tightly arranged hexagons.

The outer trench 129 surrounds the gate electrodes 142 and the source electrodes 141 from outside continuously without interruption. Alternatively, the outer trench 129 may surround the gate electrodes 142 and the source electrodes 141 partially discontinuously. In this embodiment, a single ply of the outer trench 129 surrounds the gate electrodes 142 and the source electrodes 141 from outside. Alternatively, multiple plies of the outer trench 129 may surround the gate electrodes 142 and the source electrodes 141. Surrounding the gate electrodes 142 and the source electrodes 141 by a single ply of the outer trench 129 like in this embodiment allows reduction in the area of the non-active region, thereby broadening the active region relatively.

A-2. Effect

As described above, the semiconductor device 100 of this embodiment includes the outer electrode 148 in addition to the conductor 146. This makes it possible to alleviate electric field concentration at an end portion and the vicinity of the end portion of the bottom surface of the outer trench 129 at the outermost position in the active region. The following describes effect achieved by the semiconductor device 100.

Figure 3:
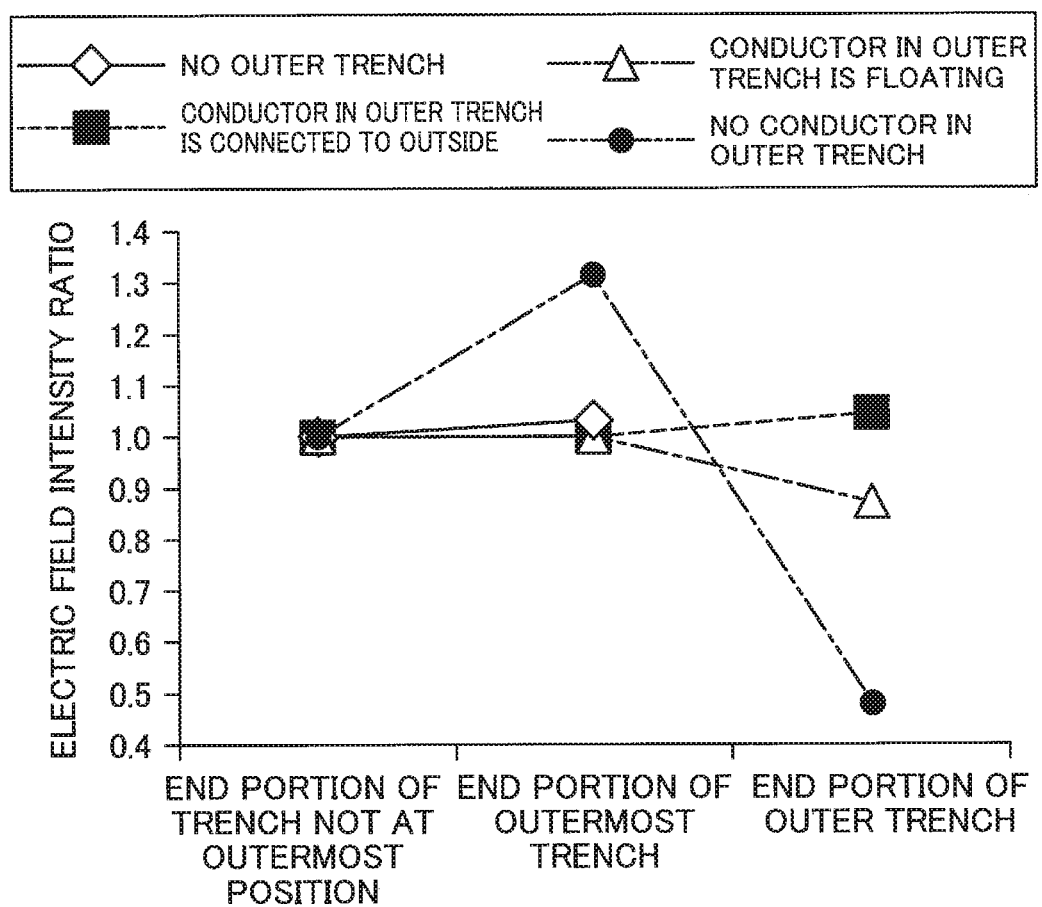
FIG. 3 shows an electric field intensity ratio at an end portion of the bottom surface of a trench.

FIG. 3 shows an electric field intensity ratio at an end portion of the bottom surface of a trench where electric field concentration is most likely to occur. The likelihood of electric field concentration is increased with increase in an electric field intensity. Generally, electric field concentration is more likely to occur at an end portion of the bottom surface of an outermost trench 122 than at end portions of the bottom surfaces of the other trenches 122.

The vertical axis of FIG. 3 shows an electric field intensity ratio relative to an electric field intensity at an end portion of the bottom surface of a trench 122 not at the outermost position as 1. FIG. 3 shows electric field intensity ratios as follows: (i) an electric field intensity ratio at the end portion of the bottom surface of the trench 122 not at the outermost position; (ii) an electric field intensity ratio at the end portion of the bottom surface of the outermost trench 122; and (iii) an electric field intensity ratio at an end portion of the bottom surface of the outer trench 129.

FIG. 3 shows the following cases: (i) a case in the absence of the outer trench 129; (ii) a case where the conductor 146 is formed in the outer trench 129 covered by the second insulating film 132 and the conductor 146 is connected to a different electrode; (iii) a case where the conductor 146 is formed in the outer trench 129 covered by the second insulating film 132 and the conductor 146 is not connected to a different electrode; and (iv) a case where only an insulating film is formed in the outer trench 129.

Results of FIG. 3 show the following. In each of the case where only the insulating film is formed in the outer trench 129 and the case in the absence of the outer trench 129, an electric field intensity ratio is high at the end portion of the bottom surface of the outermost trench 122 to bring an unfavorable result. If the conductor 146 is formed in the outer trench 129 and the conductor 146 is connected to a different electrode, an electric field intensity ratio is high at the end portion of the bottom surface of the outer trench 129 to bring an unfavorable result.

By contrast, if the conductor 146 is formed in the outer trench 129 covered by the second insulating film 132 and the conductor 146 is not connected to a different electrode, an electric field intensity ratio at the end portion of the bottom surface of the trench 122 not at the outermost position and an electric field intensity ratio at the end portion of the bottom surface of the outermost trench 122 are substantially equal. In this case, an electric field intensity ratio at the end portion of the bottom surface of the outer trench 129 is lower than an electric field intensity ratio at the end portion of the bottom surface of the outermost trench 122. Thus, this case is found to be most preferable of the conditions shown in FIG. 3.

Figure 4:
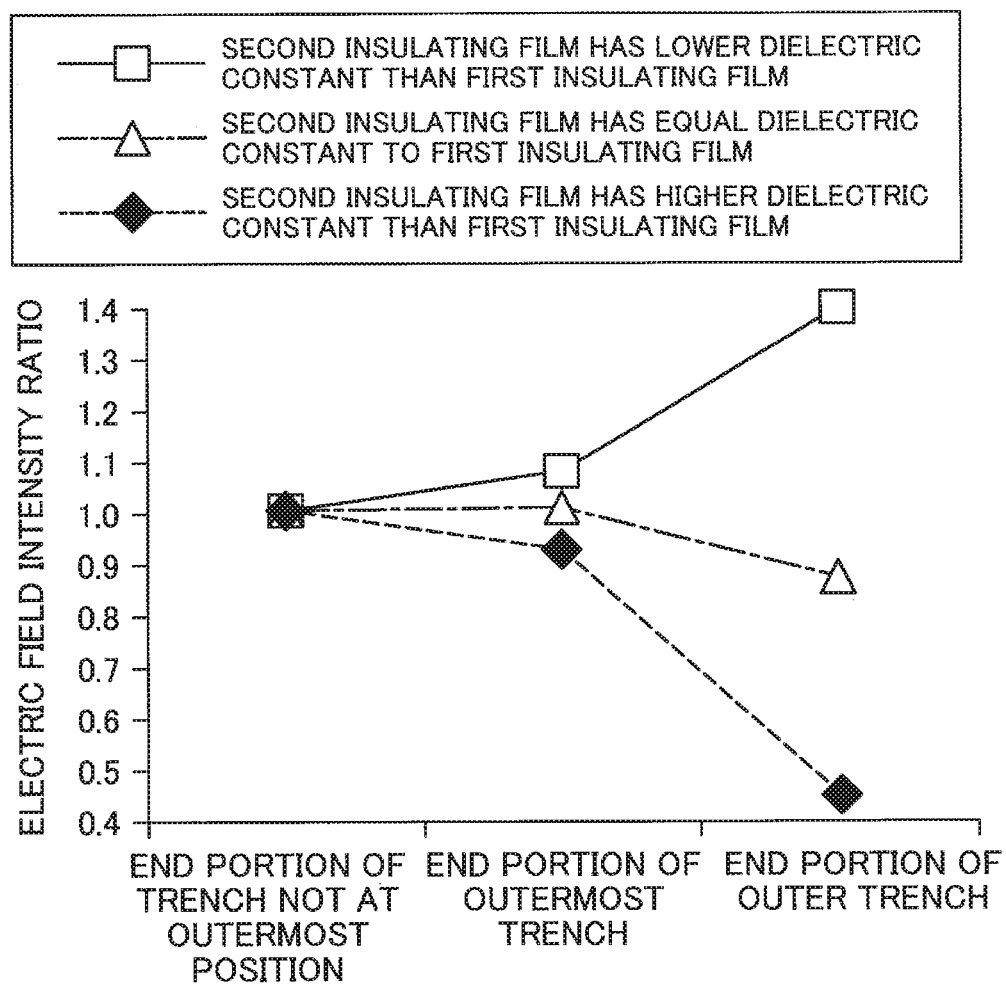
FIG. 4 shows a relationship between the dielectric constant of a first insulating film and the dielectric constant of a second insulating film.

FIG. 4 shows a relationship between the dielectric constant of the first insulating film 130 covering the surface of the trench 122 and the dielectric constant of the second insulating film 132 covering the surface of the outer trench 129. Like in FIG. 3, the vertical axis of FIG. 4 shows an electric field intensity ratio relative to an electric field intensity at the end portion of the bottom surface of the trench 122 not at the outermost position as 1. An electric field intensity of FIG. 4 means a maximum electric field intensity in an insulating film. Like in FIG. 3, FIG. 4 shows electric field intensity ratios as follows: (i) an electric field intensity ratio at the end portion of the bottom surface of the trench 122 not at the outermost position; (ii) an electric field intensity ratio at the end portion of the bottom surface of the outermost trench 122; and (iii) an electric field intensity ratio at the end portion of the bottom surface of the outer trench 129.

FIG. 4 shows the following cases: (i) a case where the second insulating film 132 has a higher dielectric constant than the first insulating film 130; (ii) a case where the second insulating film 132 has an equal dielectric constant to the first insulating film 130; and (iii) a case where the second insulating film 132 has a lower dielectric constant than the first insulating film 130.

Results of FIG. 4 show the following. If the second insulating film 132 has a lower dielectric constant than the first insulating film 130, an electric field intensity ratio at the end portion of the bottom surface of the outermost trench 122 is higher than an electric field intensity ratio at the end portion of the bottom surface of the trench 122 not at the outermost position. Further, an electric field intensity ratio at the end portion of the bottom surface of the outer trench 129 is higher than an electric field intensity ratio at the end portion of the bottom surface of the outermost trench 122. This brings an unfavorable result as electric field concentration occurs at the end portion of the bottom surface of the outermost trench 122 and the end portion of the bottom surface of the outer trench 129.

By contrast, according to the configuration of this embodiment, specifically, if the second insulating film 132 has a higher dielectric constant than the first insulating film 130, an electric field intensity ratio at the end portion of the bottom surface of the outermost trench 122 is lower than an electric field intensity ratio at the end portion of the bottom surface of the trench 122 not at the outermost position. Further, an electric field intensity ratio at the end portion of the bottom surface of the outer trench 129 is lower than an electric field intensity ratio at the end portion of the bottom surface of the outermost trench 122. This shows that electric field concentration is alleviated at the end portion of the bottom surface of the outer trench 129 and the end portion of the bottom surface of the outermost trench 122.

Figure 5:
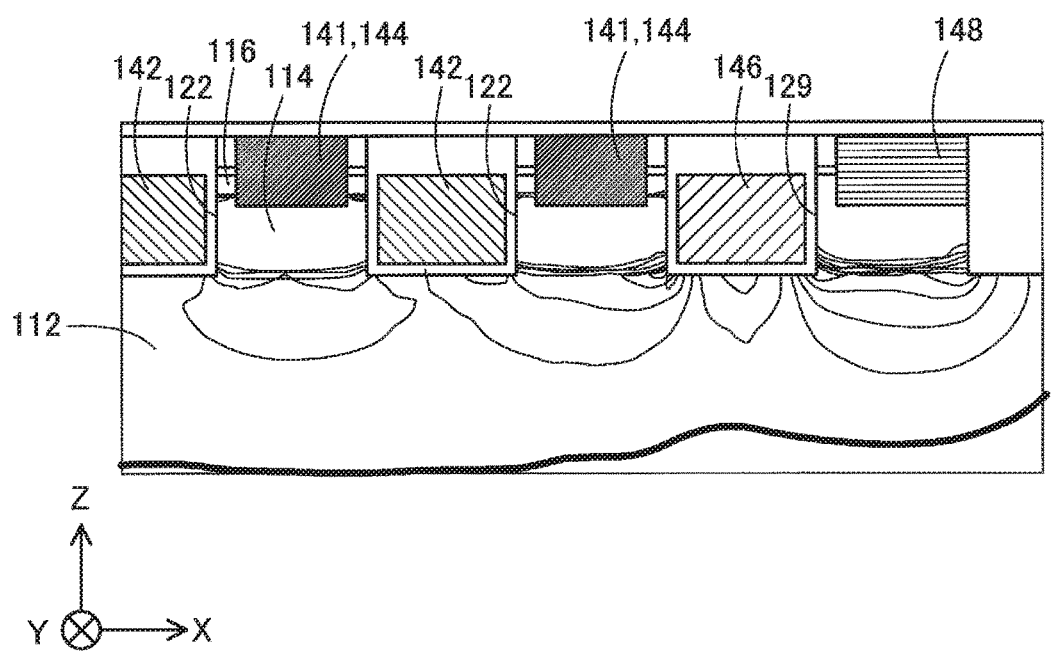
FIGS. 5 to 7 each show a simulation result about an electric field intensity distribution.
Figure 6:
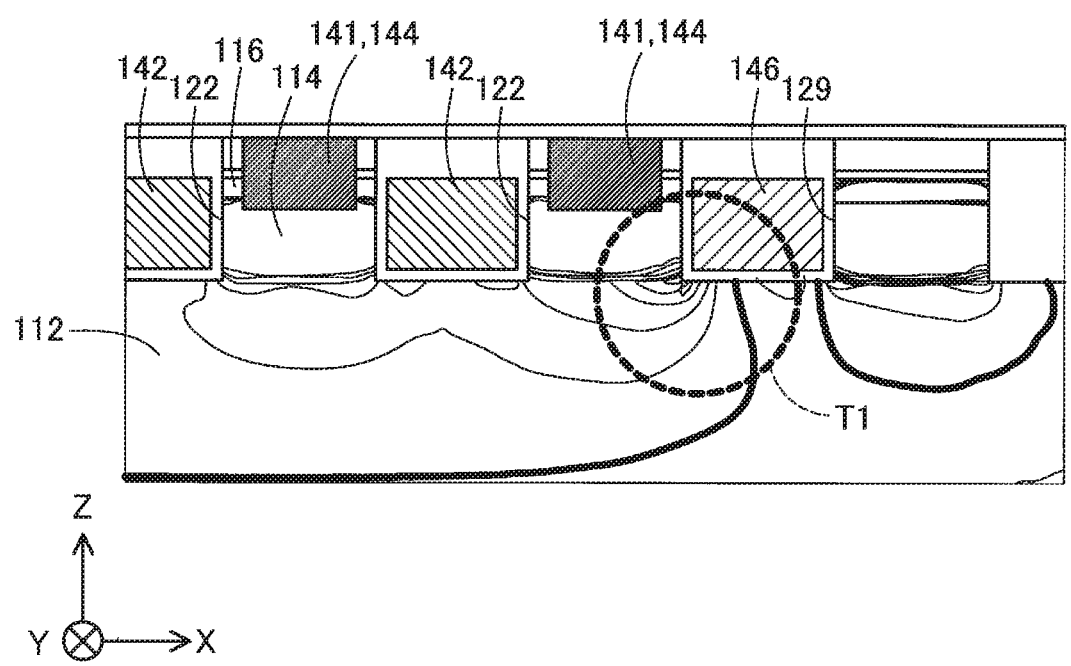
Figure 7:
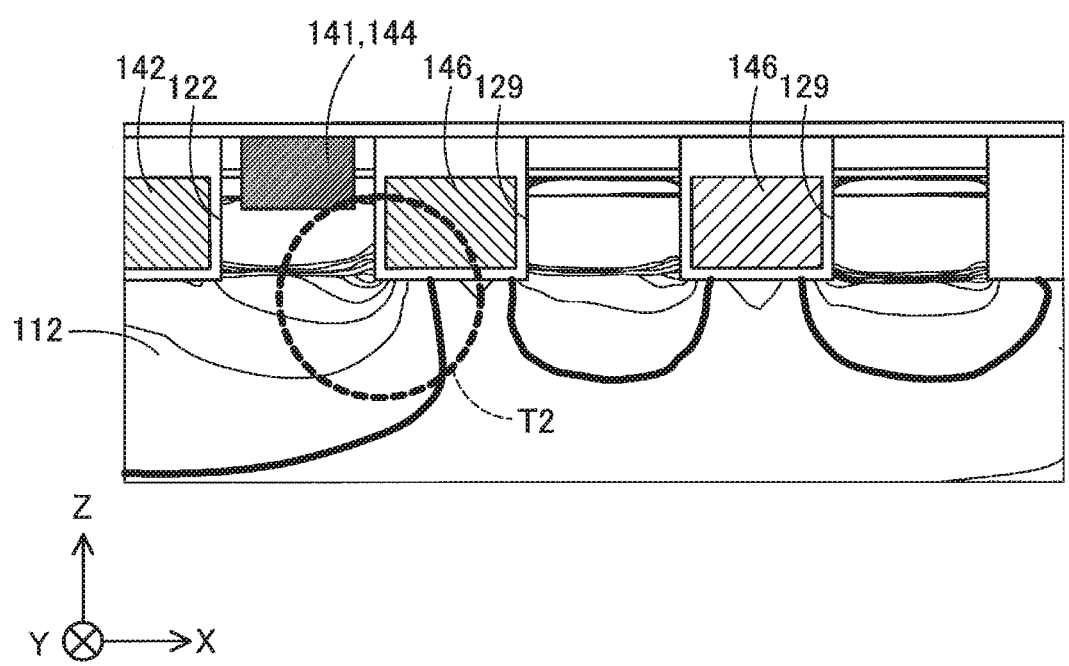

FIGS. 5 to 7 each show a simulation result about an electric field intensity distribution. FIG. 5 shows a simulation result about a configuration including the conductor 146 and the outer electrode 148 like in this embodiment. FIG. 6 shows a simulation result about a configuration formed by eliminating the outer electrode 148 from the configuration of this embodiment. FIG. 7 shows a simulation result about a configuration formed by eliminating the outer electrode 148 from the configuration of this embodiment and including two plies of the conductor 146. In each of FIGS. 5 to 7, a bold line in the first semiconductor layer 112 shows an equipotential line of an equal potential.

In the case of FIG. 6, specifically, in the configuration formed by eliminating the outer electrode 148 from the configuration of this embodiment, a potential does not extend in the X axis direction to cause electric field concentration at an end portion and the vicinity of the end portion of the bottom surface of the outer trench 129, as indicated by a region T1 in FIG. 6. Likewise, in the case of FIG. 7, specifically, in the configuration formed by eliminating the outer electrode 148 from the configuration of this embodiment and including two plies of the conductor 146, electric field concentration occurs at an end portion and the vicinity of the end portion of the bottom surface of the outer trench 129, as indicated by a region T2 in FIG. 7. By contrast, FIG. 5 corresponding to the simulation result about this embodiment shows that, a potential extends in the X axis direction, so that electric field concentration is alleviated at an end portion and the vicinity of the end portion of the bottom surface of the outer trench 129. Specifically, the provision of the outer electrode 148 in addition to the conductor 146 in the semiconductor device 100 of this embodiment allows alleviation of electric field concentration at an end portion and the vicinity of the end portion of the bottom surface of the outer trench 129.

B. Second Embodiment

Figure 8:
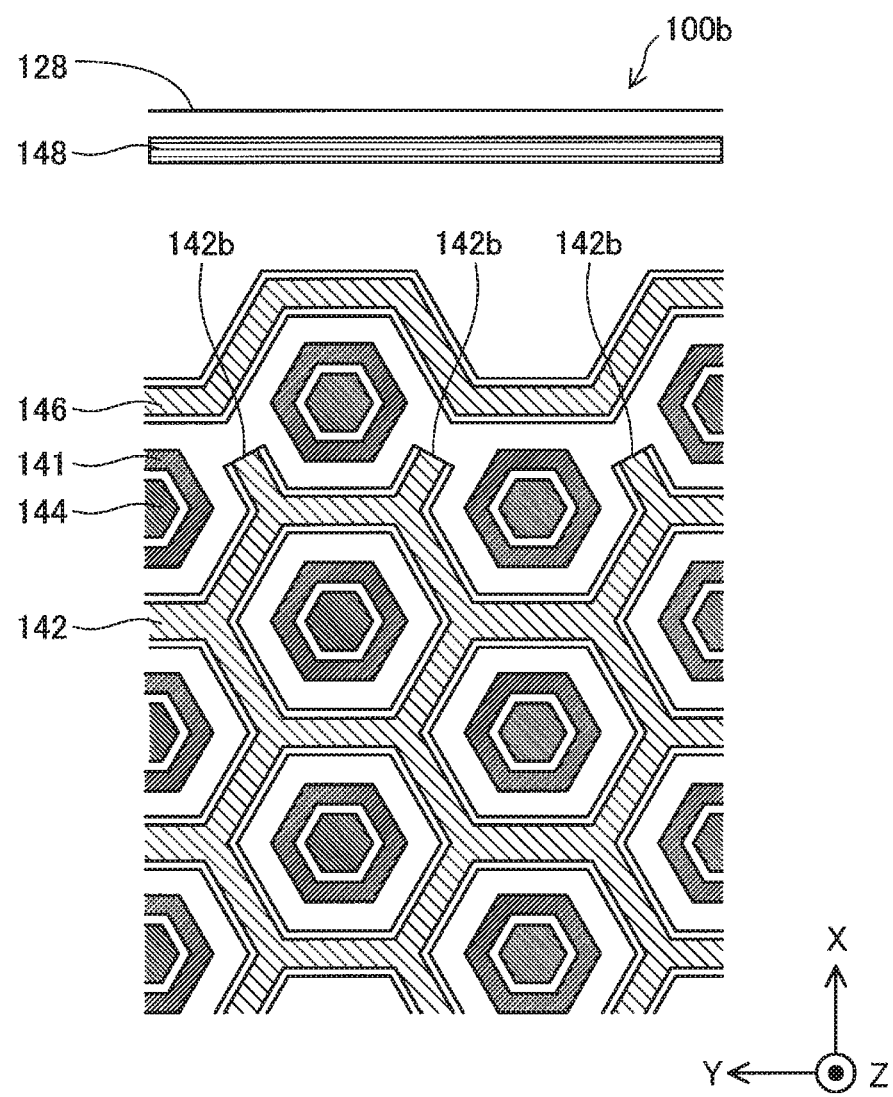
FIG. 8 is a sectional view schematically showing the configuration of a semiconductor device according to a second embodiment.

FIG. 8 is a sectional view schematically showing the configuration of a semiconductor device 100*b* according to a second embodiment. From a viewpoint of facilitating understanding, illustrations of the first insulating film 130, the second insulating film 132, the third insulating film 150, and the wiring electrode 160 are omitted from FIG. 8 and subsequent drawings. In the semiconductor device 100*b*, the shape of the outermost trench 122 and the shape of the gate electrode 142 differ from the corresponding shapes in the semiconductor device 100 of the first embodiment.

In the second embodiment, the gate electrode 142 viewed in the thickness direction (Z axis direction) includes a projecting portion 142*b* formed at a corner of the corners of the gate electrode 142 nearest the conductor 146 and projecting toward the conductor 146. The provision of the projecting portion 142*b* in the semiconductor device 100*b* of the second embodiment allows increase in a gate width in one chip to allow flow of a large current.

C. Third Embodiment

Figure 9:
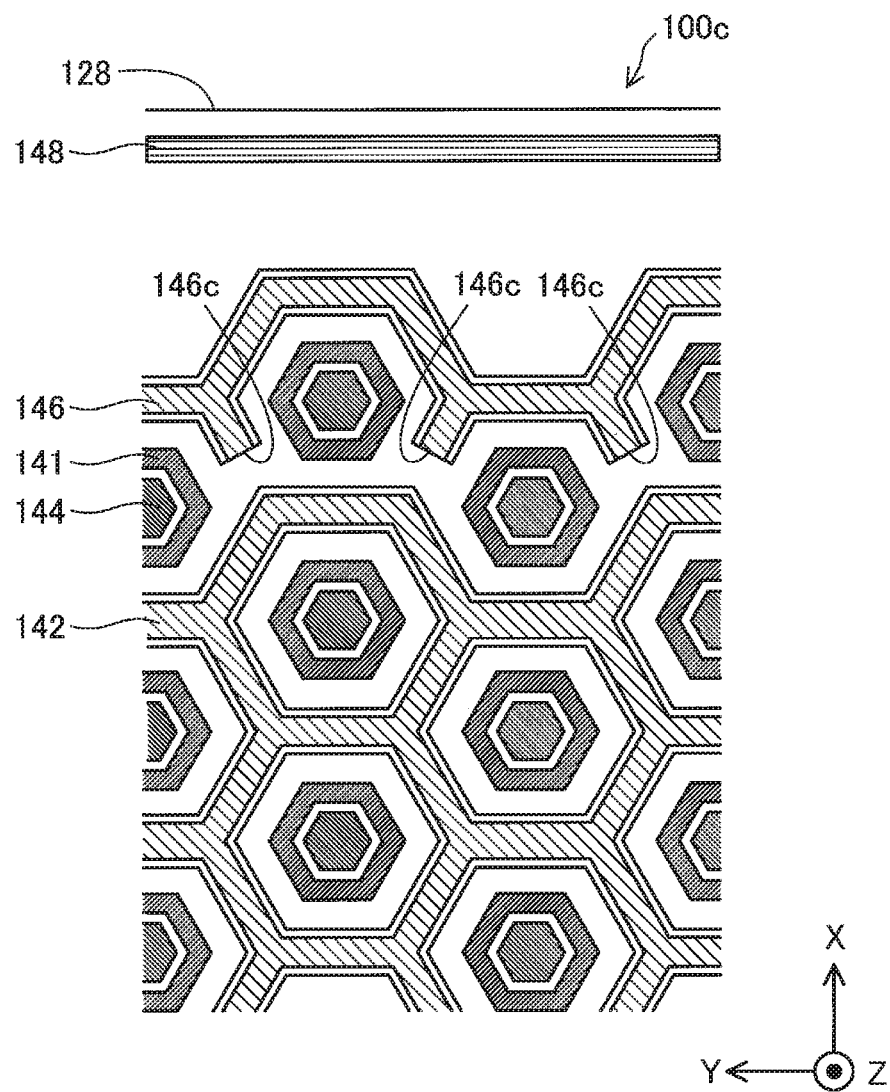
FIG. 9 is a sectional view schematically showing the configuration of a semiconductor device according to a third embodiment.

FIG. 9 is a sectional view schematically showing the configuration of a semiconductor device 100*c* according to a third embodiment. In the semiconductor device 100*c*, the shape of the conductor 146 differs from the corresponding shape in the semiconductor device 100 of the first embodiment.

In the third embodiment, the conductor 146 viewed in the thickness direction (Z axis direction) includes a projecting portion 146*c* formed at a corner of the corners of the conductor 146 nearest the gate electrode 142 and projecting toward the gate electrode 142. The provision of the projecting portion 146*c* in the semiconductor device 100*c* of the third embodiment makes it possible to more effectively alleviate electric field concentration at the bottom surface and the vicinity of the bottom surface of the trench 122 at a corner of the gate electrode 142 nearest the conductor 146.

D. Fourth Embodiment

Figure 10:
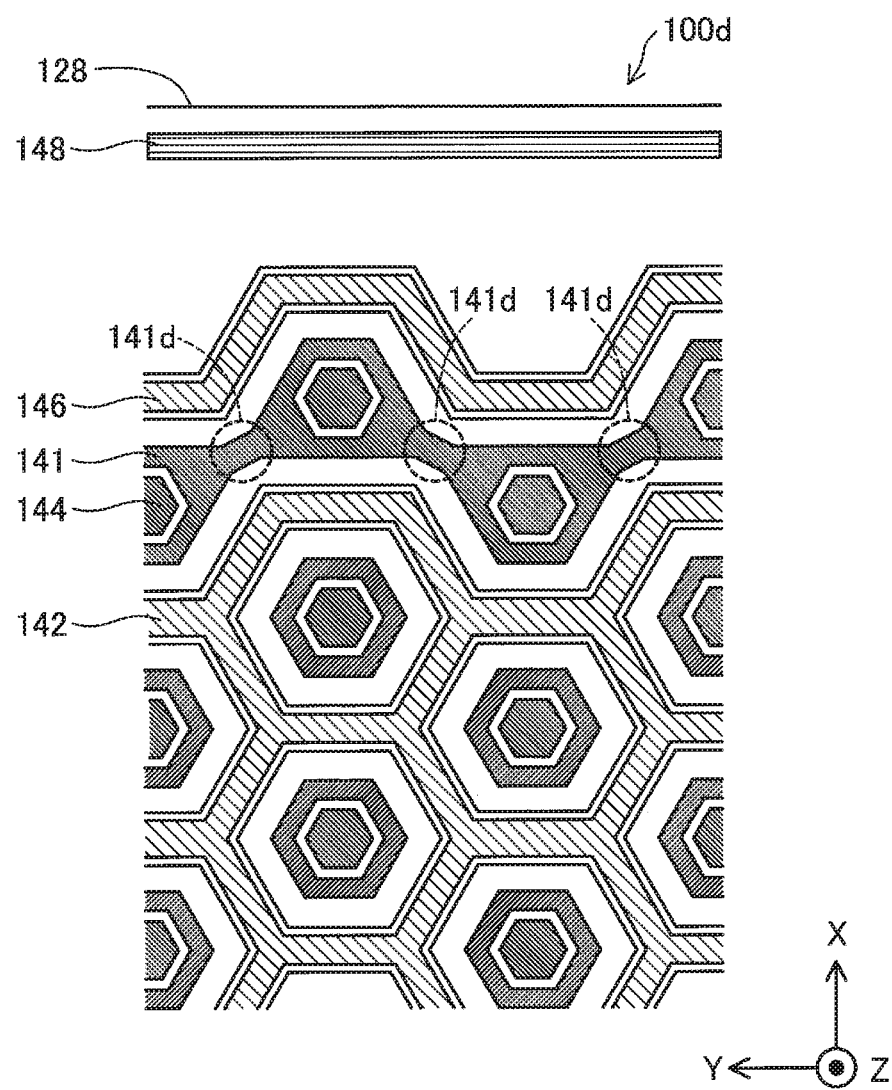
FIG. 10 is a sectional view schematically showing the configuration of a semiconductor device according to a fourth embodiment.

FIG. 10 is a sectional view schematically showing the configuration of a semiconductor device 100*d* according to a fourth embodiment. In the semiconductor device 100*d*, the shape of an outermost source electrode 141 differs from the corresponding shape in the semiconductor device 100 of the first embodiment.

In the fourth embodiment, multiple outermost source electrodes 141 include a connection 141*d* electrically connecting adjacent ones of the source electrodes 141. The provision of the connection 141*d* in the semiconductor device 100*d* of the fourth embodiment makes it possible to cause a current to flow further in the connection 141*d* to allow flow of a large current.

E. Fifth Embodiment

Figure 11:
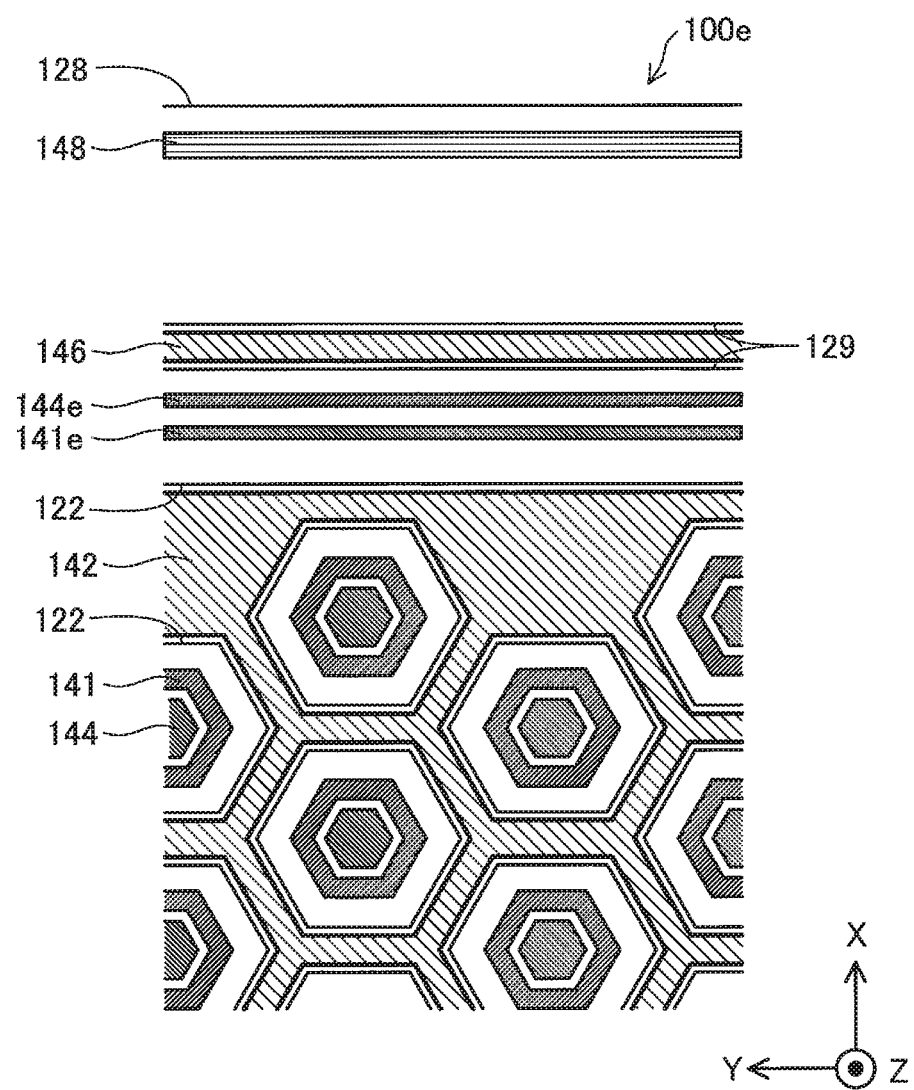
FIG. 11 is a sectional view schematically showing the configuration of a semiconductor device according to a fifth embodiment.

FIG. 11 is a sectional view schematically showing the configuration of a semiconductor device 100*e* according to a fifth embodiment. In the semiconductor device 100*e*, the shape of the outer periphery of the trench 122, the shape of an outermost source electrode 141*e*, and the shape of an outermost body electrode 144*e* differ from the corresponding shapes in the semiconductor device 100 of the first embodiment.

In the fifth embodiment, an outermost end portion of the trench 122 viewed in the thickness direction (Z axis direction) is formed to be separated from the outer trench 129 by a constant distance. Thus, in this embodiment, the outermost end portion of the trench 122 and the outer trench 129 are parallel to each other.

The outermost end portion of the trench 122 and the outermost source electrode 141*e* are formed to be separated from each other by a constant distance. Likewise, the outermost end portion of the trench 122 and the outermost body electrode 144*e* are formed to be separated from each other by a constant distance. In this embodiment, the outermost end portion of the trench 122, the outermost source electrode 141*e*, and the outermost body electrode 144*e* are parallel to each other.

In the semiconductor device 100*e* of the fifth embodiment, the outermost end portion of the trench 122 is formed to be separated from the outer trench 129 by a constant distance. This makes it possible to more effectively alleviate electric field concentration at the bottom surface and the vicinity of the bottom surface of the outermost end portion of the trench 122.

F. Other Embodiments

The present invention is not limited to the above-described embodiments or examples but is feasible in various configurations within a range not deviating from the substance of the invention. For example, technical features in the embodiments, those in the examples, or those in the modifications corresponding to technical features in each aspect described in SUMMARY may be replaced or combined, where appropriate, with the intention of solving some or all of the foregoing problems or achieving some or all of the foregoing effects. Unless being described as absolute necessities in this specification, these technical features may be deleted, where appropriate.

A semiconductor device to which the present invention is applied is not limited to the vertical trench MOSFET described in the foregoing embodiments. The present invention is further applicable to a device having a trench gate configuration such as an insulated gate bipolar transistor (IGBT), for example.

In the foregoing embodiments, the acceptor element in the second semiconductor layer 114 is magnesium (Mg). Alternatively, zinc (Zn) may be used as the acceptor element, for example.

In the foregoing embodiments, the donor element in the substrate 110, the first semiconductor layer 112, and the third semiconductor layer 116 is silicon (Si). Alternatively, germanium (Ge) may be used as the donor element, for example.

In the foregoing embodiments, the gate electrodes 142 viewed in the thickness direction have a mesh pattern with tightly arranged hexagons. Further, the conductor 146 has a shape extending along the outer periphery of the pattern with tightly arranged hexagons. However, this pattern is not limited to a pattern with hexagons but it may be a pattern with polygons such as triangles or rectangles and such polygons are preferably arranged most densely.

All the features from the second embodiment to the fourth embodiment may be combined freely.

What is claimed is:

1. A semiconductor device having an active region and a non-active region surrounding the outer periphery of the active region, the semiconductor device comprising:
   a first semiconductor layer having a first conductivity type and extending in a plane direction;

a second semiconductor layer formed on the first semiconductor layer and having a second conductivity type different from the first conductivity type; and a third semiconductor layer formed on the second semiconductor layer and having the first conductivity type, the first semiconductor layer, the second semiconductor layer, and the third semiconductor layer being made of a wide band-gap semiconductor, in the active region, the semiconductor device comprising a trench, a first insulating film, a control electrode, and a contact electrode, the trench penetrating the third semiconductor layer and the second semiconductor layer to reach the first semiconductor layer, the first insulating film covering the surface of the trench, the control electrode being formed in the trench covered by the first insulating film, the contact electrode contacting the third semiconductor layer, in the non-active region, the semiconductor device comprising an outer trench, a second insulating film, a conductor, and an outer electrode, the outer trench penetrating the third semiconductor layer and the second semiconductor layer to reach the first semiconductor layer, and surrounding the active region, the second insulating film covering the surface of the outer trench, the conductor being formed in the outer trench covered by the second insulating film and electrically insulated from the control electrode and the contact electrode, the outer electrode being located outside the outer trench, contacting the second semiconductor layer, and being electrically connected to the contact electrode.

2. The semiconductor device in accordance with claim 1, wherein
the second insulating film has a higher dielectric constant than the first insulating film.

3. The semiconductor device in accordance with claim 1, wherein
in a view taken in a thickness direction perpendicular to the plane direction, the control electrode has a mesh pattern with tightly arranged polygons, and
the control electrode includes a projecting portion formed at a corner of the corners of each of the polygons nearest the conductor and projecting toward the conductor.

4. The semiconductor device in accordance with claim 1, wherein
in a view taken in a thickness direction perpendicular to the plane direction, the control electrode has a mesh pattern with tightly arranged polygons,
the conductor has a shape extending along an outer periphery of the pattern with the tightly arranged polygons, and
the conductor has a projecting portion formed at a corner of the corners of each of the polygons of the conductor nearest the control electrode and projecting toward the control electrode.

5. The semiconductor device in accordance with claim 1, wherein
the contact electrode includes multiple contact electrodes, and
the multiple contact electrodes located outside the control electrode and inside the conductor include a connection electrically connecting adjacent ones of the contact electrodes.

6. The semiconductor device in accordance with claim 1, wherein
the trench has an outermost end portion formed to be separated from the outer trench by a constant distance.

* * * * *